United States Patent
Kim et al.

(10) Patent No.: US 8,055,836 B2
(45) Date of Patent: Nov. 8, 2011

(54) SEMICONDUCTOR MEMORY SYSTEM AND WEAR-LEVELING METHOD THEREOF

(75) Inventors: Soo-Jeong Kim, Seoul (KR);
Jun-Young Cho, Seongnam-si (KR);
Min-Soo Moon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 476 days.

(21) Appl. No.: 12/316,508

(22) Filed: Dec. 12, 2008

(65) Prior Publication Data

US 2009/0157952 A1    Jun. 18, 2009

(30) Foreign Application Priority Data

Dec. 13, 2007   (KR) .................. 10-2007-0130186

(51) Int. Cl.
*G06F 12/00* (2006.01)
(52) U.S. Cl. ......... 711/103; 711/156; 711/165; 711/170
(58) Field of Classification Search .................. None
See application file for complete search history.

(56) References Cited

U.S. PATENT DOCUMENTS

| | | | |
|---|---|---|---|
| 6,587,915 B1 | 7/2003 | Kim | |
| 6,973,531 B1 | 12/2005 | Chang et al. | |
| 6,985,992 B1 | 1/2006 | Chang et al. | |
| 2002/0199129 A1* | 12/2002 | Bohrer et al. | ............... 714/7 |
| 2007/0294490 A1* | 12/2007 | Freitas et al. | ............ 711/154 |

FOREIGN PATENT DOCUMENTS

| | | |
|---|---|---|
| KR | 2001-0029171 | 4/2001 |
| KR | 10-2005-0050148 | 5/2005 |
| KR | 10-2005-0059314 | 6/2005 |

* cited by examiner

*Primary Examiner* — Shawn X Gu
(74) *Attorney, Agent, or Firm* — Onello & Mello, LLP

(57) ABSTRACT

Disclosed is a semiconductor memory system and wear-leveling method thereof. The semiconductor memory system is comprised of a nonvolatile memory including a plurality of logic blocks each of which is divided into a plurality of entries, a file system detecting a type of data to be stored and allocating the logic block or the entry for storing the data in accordance with the data type, and a translation layer leveling wearing degrees over the logic blocks or the entries in accordance with the data type.

24 Claims, 7 Drawing Sheets

Fig. 5A

| Header | (Blk cnt) |
|---|---|
| CD | |

Fig. 5B

| | Header | (Blk cnt) |
|---|---|---|
| E1 | HD1 | (E1 cnt) |
| E2 | HD2 | (E2 cnt) |
| E3 | HD3 | (E3 cnt) |
| E4 | HD4 | (E4 cnt) |

Fig. 6

| | Header | (0) |
|---|---|---|
| E1 | HD1 | (4) |
| E2 | HD2 | (3) |
| E3 | HD3 | (1) |
| E4 | HD4 | (2) |

HD1 Change →

| | Header | (0) |
|---|---|---|
| E1 | HD3 | (5) |
| E2 | HD2 | (3) |
| E3 | HD1 | (2) |
| E4 | HD4 | (2) |

SEMICONDUCTOR MEMORY SYSTEM AND WEAR-LEVELING METHOD THEREOF

CROSS-REFERENCE TO RELATED APPLICATIONS

This U.S. non-provisional patent application claims priority under 35 U.S.C. §119 of Korean Patent Application No. 10-2007-0130186 filed on Dec. 13, 2007, the entire contents of which are incorporated herein by reference.

FIELD OF INVENTION

The present invention relates to semiconductor memory systems. More particularly, the present invention is concerned with a semiconductor memory system and a wear-leveling method thereof.

BACKGROUND

Semiconductor memory devices are configured to store data therein. Semiconductor memory devices are generally divided into volatile and nonvolatile types. Nonvolatile memory devices retain data stored therein even without power supply, while volatile memory devices lose their data when power supplies are interrupted or suspended.

With data retention capability in low power, nonvolatile memory devices are nowadays regarded as useful storage media for portable apparatuses. Nonvolatile memories include various kinds, e.g., flash memories, phase-change random access memories (PRAMs), ferroelectric RAMs (FeRAMs), magnetic RAMs (MRAMs), and so on.

Flash memories are suitable for high integration density, widely used over mobile systems on the merits of nonvolatiles. A flash memory is organized by including pluralities of memory blocks.

MRAMs, like hard disks, store data by means of magnetic properties. MRAMs employ ferromagnetic tunnel magneto resistance (TMR) devices for storing data.

PRAMs are operable by using thin film materials such as chalcogenide alloys (e.g., Ge2Sb2Te5; GST), which are used in CD-ROMs or DVD-RAMs. Resistance of such a chalcogenide alloy becomes larger in an amorphous state, but smaller in a crystalline state. Thus, data '1' or '0' is stored therein by sensing a level of resistance from the chalcogenide alloy film.

FeRAMs utilize ferroelectric materials for storing data. In a ferroelectric material, a polarization is directional by a voltage applied thereto. Therefore, data is distinguished with reference to a polarized orientation in a FeRAM.

In the meantime, there is a limit to change times of data stored in such a semiconductor memory device because it is gradually becomes worn out by repetitive writing and erasing operations. With an increase in wearing degree, it takes a longer time to change (e.g., write or erase) data, which raises the probability of malfunctions while changing data. Consequently, a unit cell of the semiconductor memory device could be deprived of its own data storage capability.

In a semiconductor memory device, wearability against the writing and erasing operations is typically represented as an index of endurance. Endurance of the semiconductor memory device is determined by operable (or usable) writing or erasing times without malfunctions. Endurance of the semiconductor memory device is usually rated up to tens of thousands to millions in usable times.

In order to lengthen a lifetime (or wearability) of a semiconductor memory device, it requires uniformity of data change events (e.g., writing or erasing). If operations for changing data states are concentrated on a specific area of a semiconductor memory device, it eventually causes a great deal of decadence to a lifetime thereof. But if data changing operations are conducted uniformly over cell areas of a semiconductor memory device, it may extend its lifetime significantly.

There have been proposed many ways of leveling or managing wearability of semiconductor memory devices such as flash memories. However, different from other kinds of memories, flash memories are inoperable in an overwriting mode. PRAMs, MRAM, or FeRAMs would be degraded in performance if the wear-leveling schemes used for the flash memories were applied thereto, because those memories are operable in the overwriting mode. Therefore, there is a need of providing a wear-leveling scheme for a semiconductor memory system that is operable in the overwriting mode.

SUMMARY OF THE INVENTION

Aspects of the present invention are directed to a semiconductor memory system having an improved wear-leveling scheme that selectively arranges wear-leveling units in accordance with data types.

Aspects of the present invention are also directed to a wear-leveling method that selectively arranges wear-leveling units in accordance with data types.

Aspects of the present invention are also directed to a wear-leveling method capable of lengthening a lifetime of a semiconductor memory device by selectively arranging wear-leveling units in accordance with data types.

In accordance with one aspect of the present invention, provided is a semiconductor memory system comprised of: a nonvolatile memory including a plurality of logic blocks each of which is divided into a plurality of entries; a file system that detects a type of data to be stored and allocates a logic block or an entry for storing the data in accordance with the data type; and a translation layer that levels wearing degrees over the logic blocks or the entries in accordance with the data type.

Each entry in an allocated logic block can have a number of entries a number of wearing times and the translation layer can detect whether a number of entry wearing times of an allocated entry in the allocated logic block reaches a predetermined threshold value, and can exchange data stored in the plurality of entries of the allocated logic block in accordance with a result of the detection.

The translation layer can be configured to conduct the data exchange by exchanging data stored in an entry whose number of wearing times reaches the threshold value for data stored in another entry having a smaller number of wearing times.

The translation layer can be configured to exchange the data of the plurality of entries for each other until all the numbers of entry wearing times of the allocated logic block reach the threshold value.

The translation layer can be configured to determine the threshold value in accordance with an update frequency of the data to be stored.

The translation layer can be configured to increase the threshold value, if the update frequency of the data to be stored is high.

The translation layer can be configured to decrease the threshold value, if the update frequency of the data to be stored is low.

The translation layer can be configured to increase the number of block wearing times by the threshold value and reset the numbers of entry wearing times, if the numbers of entry wearing times of the entries reach the threshold value.

The translation layer can be configured to increase the number of block wearing times by a mean value of the numbers of entry wearing times and reset the numbers of entry wearing times, while retrieving the logic block, if variation of the numbers of the entry wearing times of the entries is relatively small.

The translation layer can make the logic block invalid and maintain the numbers of entry wearing times, while retrieving the logic block, if variation of the numbers of the entry wearing times of the entries is relatively large.

The file system can be one of a file allocation table (FAT), a Symbian FAT, and an embedded file system 2 (EFS2).

The file system can be configured to allocate the entry for storing the hot data, if the data to be stored is hot data.

The file system can be configured to allocate the logic block for storing the cold data, if the data to be stored is cold data.

The translation layer can be configured to allocate the logic block with reference to the number of block wearing times.

The translation layer can be configured to first allocate a logic block that has the smallest number of wearing times.

The nonvolatile memory can be overwritable.

The nonvolatile memory can be one of a phase-changeable random access memory, a magnetic random access memory, and a ferroelectric random access memory.

The logic block can be sized in accordance with a type of the file system.

The file system can be configured to provide size information of the logic block to the translation layer.

The file system can be configured to determine a size of the logic block for a building or mounting time.

The entry can be sized in accordance with a type of the file system.

The file system can be configured to provide size information of the entry to the translation layer.

The file system can be configured to determine a size of the entry for a building or mounting time.

According to another aspect of the present invention, provided is a wear-leveling method for a semiconductor memory system having a plurality of logic blocks each of which is divided into a plurality of entries. The method is comprised of: detecting a type of data to be stored and allocating the logic block or the entry for the data in accordance with the data type; and managing wearing degrees over the logic block or the entries in accordance with the data type.

According to aspects of the present invention, a semiconductor memory device performance is improved by selectively arranging wear-leveling units in accordance with data types.

And a lifetime of a semiconductor memory device is extended by selectively arranging wear-leveling units in accordance with data types.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments in accordance with the present invention will be described with reference to the following figures, wherein like reference numerals refer to like parts throughout the various figures unless otherwise specified. In the figures:

FIGS. 5A and 5B show embodiments of logic blocks according to aspects of the present invention;

FIG. 6 shows an embodiment of an entry-unit wear-leveling method according to aspects of the present invention;

DETAILED DESCRIPTION OF PREFERRED EMBODIMENTS

Figure 1:
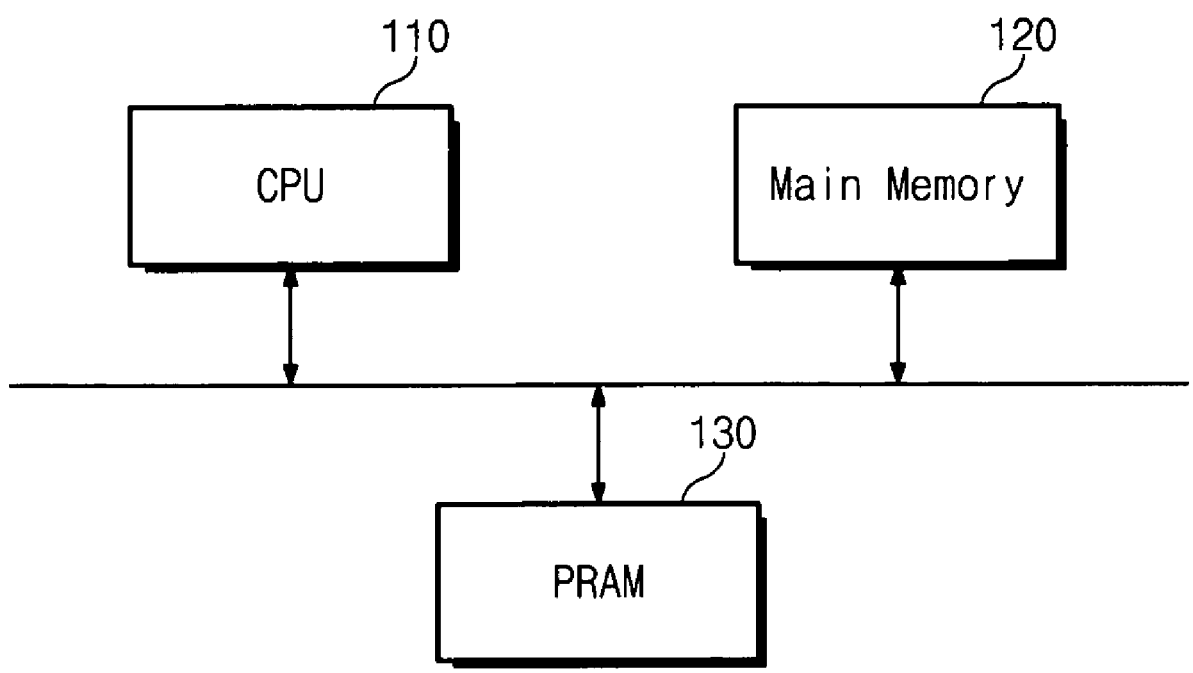
FIG. 1 is a block diagram of an embodiment of a semiconductor memory system according to aspects of the present invention.

Preferred embodiments in accordance with the present invention will be described below in more detail with reference to the accompanying drawings, involving a wear-leveling feature in consideration with data types. The present invention may, however, be embodied in different forms and should not be constructed as limited to the embodiments set forth herein. Like reference numerals refer to like elements throughout the accompanying figures.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

A semiconductor memory device according to aspects of the present invention stores data in various forms. For example, data stored in a semiconductor memory device according to aspects of the present invention may be differentiated into metadata and user data.

Metadata are provided for describing user data. Metadata define locations, sizes, attributes, etc. involved in user data. Metadata are referred by a system, not identified by a user.

Metadata are updated along with user data. Otherwise, it is also permissible for metadata to be exclusively updated, not for user data. Thus, metadata may be frequently updated, more than user data.

User data are divided into hot and cold data. Hot data means data that is small in size and accessed in high frequency. For example, hot data may be contact address data of a mobile communication terminal.

Metadata is small in size and modified frequently. Hereinafter, embodiments according to the present invention will regard metadata as same as hot data.

Cold data means data that is large in size and accessed in low frequency. For example, cold data may be large-capacity multimedia (video or audio) data. Generally, multimedia data is large in data size or volume and accessed in low frequency.

The present invention may be characterized as providing wear-leveling with consideration of data types (e.g., hot or cold data). Hereinafter described will be exemplary aspects of a wear-leveling scheme in accordance with the present invention, in conjunction with the accompanying drawings.

FIG. 1 is a block diagram of an embodiment of a semiconductor memory system according to aspects of the present invention.

Referring to FIG. 1, a semiconductor memory system 100 is comprised of a central processing unit (CPU) 110, a main memory 120, and a PRAM 130. In FIG. 1, the solid line denotes a bus through which data and commands are transferred. The PRAM 130 is used for storing data, as a nonvolatile memory device. The PRAM 130 retains its data even when power supply is suspended thereto.

Data stored in the PRAM 130 is processed by the CPU 110 after being loaded into the main memory 120. Data processed through the CPU 110 is stored in the PRAM 130. With this organization, the semiconductor memory system 100 is able to conduct a wear-leveling function in accordance with aspects of the present invention.

Figure 2:
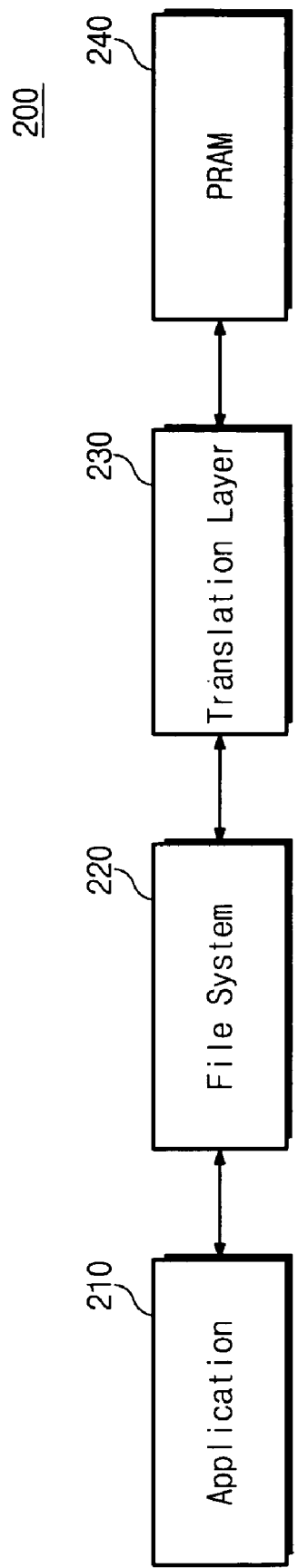
FIG. 2 is a block diagram of an embodiment of a processing layer for a wear-leveling scheme according to aspects of the present invention.

FIG. 2 is a block diagram of an embodiment of a processing layer for a wear-leveling scheme according to aspects of the present invention.

A wear-leveling scheme according to this embodiment is carried out by means of an application 210, a file system 220, a translation layer 230, and a PRAM 240.

The application 210, the file system 220, and the translation layer 230 are loaded into the main memory 120 and processed through the CPU 110.

The application 210 processes data in response to an input by a user. The application 210 processes data and provides the file system 220 with a command for storing the processed data.

The file system 220 allocates a region in which data is stored, in response to a command provided from the application 210. And the file system 220 transfers information, which is concerned with data to be stored, to the translation layer 230. The translation layer 230 manages data in response to information provided from the file system 220.

Hereinafter it will be assumed that hot data is being stored in a semiconductor memory device. For storing hot data, the application 210 transfers a corresponding command to the file system 220. The file system 220 allocates a region for data storage in response to the command provided from the application 210. And the file system 220 informs the translation layer 230 that data to be stored is hot data. The translation layer 230 manages the hot data in response to information provided from the file system.

In these embodiments, the PRAM 240 is exemplified as a semiconductor memory device. The PRAM 240 is a kind of nonvolatile memory device storing data by means of a material that is conductive with variable resistance by temperature.

The PRAM 240 operates in low power so has nonvolatile characteristics. In a writing operation of the PRAM 240, a current makes a phase-changeable material transition to a crystalline or amorphous state. Such a crystalline or amorphous state of the phase-changeable material is determined by a rate and duration of current flowing through the phase-changeable material. The PRAM 240 discriminates data '1' or '0' from a resistive gap of the phase-changeable material by current.

The PRAM is a kind of semiconductor memory device in which it is unnecessary to conduct an erase-before-write operation. The present invention is applicable to semiconductor memory devices which can overwrite data therein, not restrictive to the PRAM. Overwritable semiconductor memory devices denote nonvolatile memory units that for which there is no need of conducting erase-before-write operations. For example, overwritable semiconductor memory devices include MRAMs and FeRAMs.

Whereas there are varieties of file systems, the present invention is exemplified by adopting a file allocation table (FAT) as the file system 220, in these embodiments.

Figure 3:
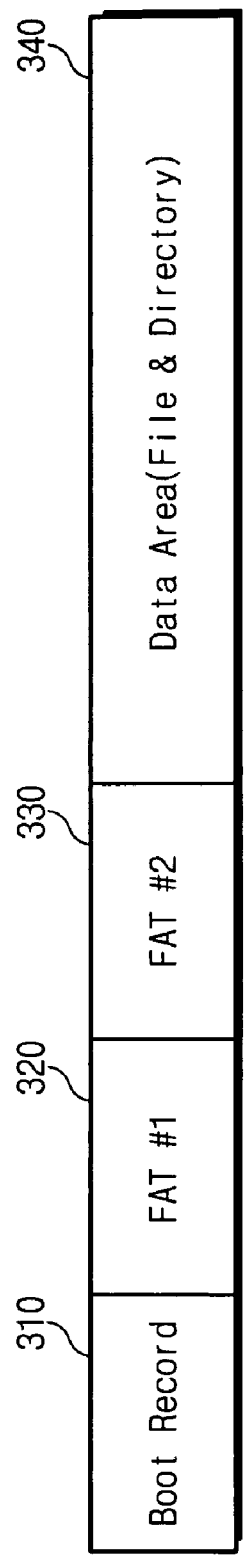
FIG. 3 shows a structure of a FAT file system.

FIG. 3 shows a structure of an example FAT file system. Referring to FIG. 3, in the FAT file system 300, the PRAM 240 is divided into a boot record field 310, a first FAT field (FAT #1) 320, a second FAT field (FAT #2) 330, and a data field 340.

The boot record field 310 stores a machine code for booting the system, and set values of the FAT file system 300. The boot record field 310 is also called a bios parameter block (BPB).

The first and second FAT fields (FAT #1 and FAT #2), 320 and 330, store a table for managing clusters. The cluster means the minimum unit to be allocated for data storage. Thus, the cluster is called 'allocation unit'.

The first FAT field (FAT #1) 320 is used to track an allocation pattern between clusters and files. From referring to the first FAT field (FAT #1) 320, it identifies a used state of cluster, and a connection pattern between clusters and filed. If the first FAT field 320 is damaged, it is unable to read a file. For that reason, the second FAT field (FAT #2) is provided thereto as a copy. Thus, the second FAT field 330 is the same as the first FAT field 320 in contents.

The data field 340 stores a file and a directory. The directory includes a directory entry. The directory entry contains file attributes such as a file name, a file size, and a file location.

In the FAT file system, the highly accessible data, such as FAT #1 320, FAT #2 330, or the directory entry, corresponds with hot data. But rarely accessed data is correspondent with cold data.

According to a condition that data to be stored is hot or cold data, the present invention enables wear-leveling schemes to differ for each type of data. Hereinafter will be described an embodiment of a wear-leveling method according to aspects of the present invention in conjunction with FIG. 4.

Figure 4:
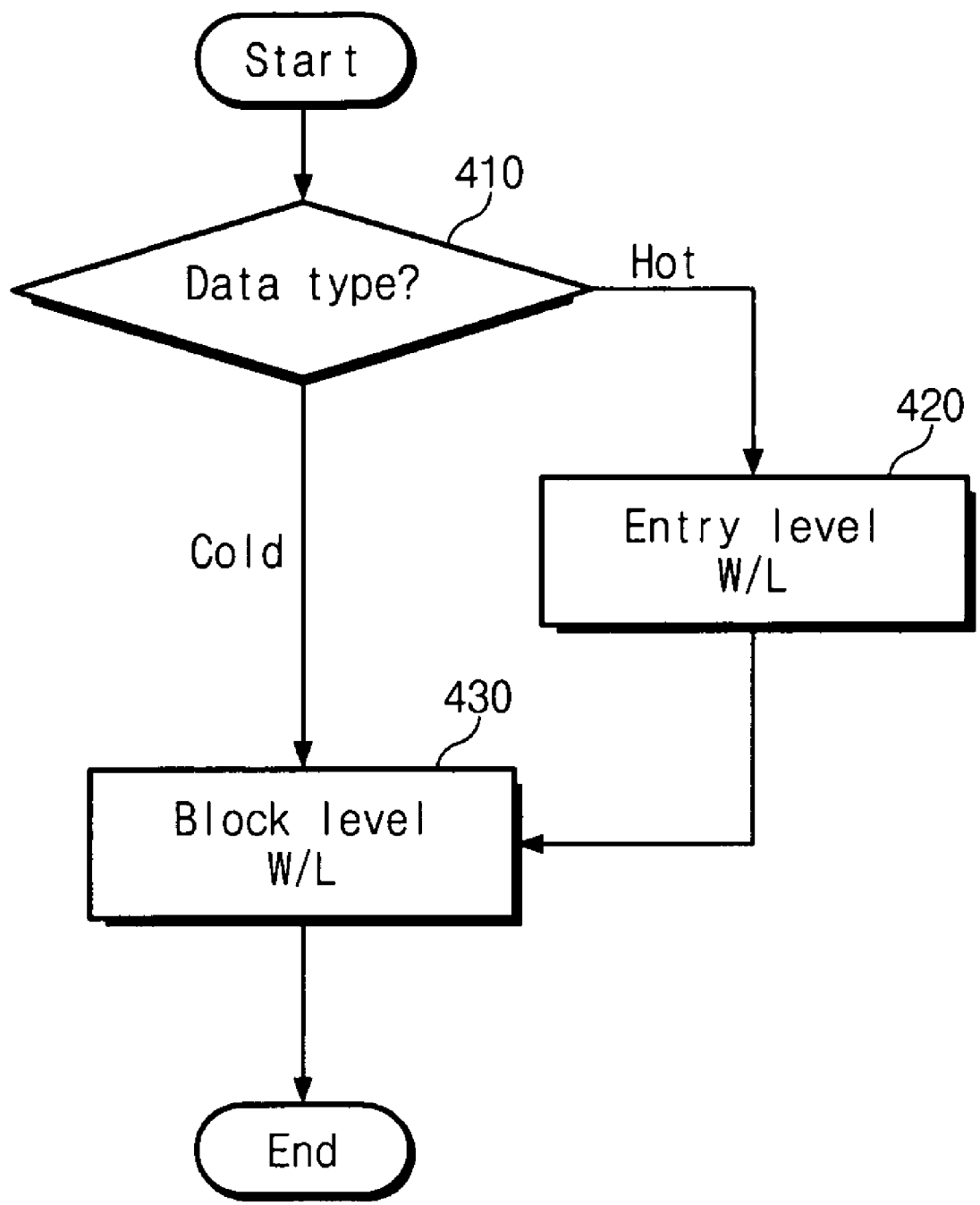
FIG. 4 is a flow chart schematically showing an embodiment of a wear-leveling method according to aspects of the present invention.

FIG. 4 is a flow chart schematically showing an embodiment of a wear-leveling method according to aspects of the present invention.

Referring to FIG. 4, first a type of data is detected (step 410). A data type is detected by the file system 220. If data to be stored is cold data, the file system informs the translation layer 230 that the data to be stored is cold data. The file system 220 allocates the entire logic blocks of the PRAM 240 in order to store the cold data.

In a case that data to be stored is cold data, the translation layer 230 conducts a wear-leveling for a plurality of logic blocks (step 430). In the wear-leveling operation, determines the numbers of wearing times of logic blocks. Then, a logic block that has the smallest number of wearing times is allocated in priority.

Here, the logic block means a sector that is divided from a memory cell array of the PRAM 240 in a logical unit. This logic block is differentiated from a physical structure of the memory cell array. For convenience of description, a size of the logic block may be the same as an allocation unit of the file system (e.g., a cluster of the FAT file system). But the present invention is not restricted hereto in the logic block size. A size of the logic block may be also determined for a building or mounting time.

If data to be stored is hot data, the file system 220 informs the translation layer 230 that the data to be stored is hot data. And, the file system 220 partly allocates the logic blocks as a region for storing the hot data. In this embodiment, the logic blocks are partly defined by entries. An entry a region of a logic block is used to store hot data. For convenience of description, a size of the entry may be same as that of a directory entry of the FAT file system. But the present invention is not restricted hereto in entry size. A size of the entry may be also determined for a building or mounting time.

In summary, if data to be stored is cold data, the wear-leveling process is carried out at the logic block level (refer to the step 430). This is because the cold data is characterized as being worn out at the logic block level. To the contrary, if data to be stored is hot data, the hot data is normally worn out at the entry level before being worn out at the logic block level (refer to step 420). Namely, according to characteristics of the hot data, it is worn out at the entry level. Now, hereinafter will be described a structure of the logic block according to aspects of the present invention in conjunction with the accompanying drawings.

FIGS. 5A and 5B show embodiments of logic blocks according to aspects of the present invention.

FIG. 5A shows a logic block storing cold data (CD). Referring to FIG. 5A, a header of the logic block stores information about the logic block. In particular, the header of the logic block stores the number of block wearing times as Blk_cnt.

The number of block wearing times is referred by the translation layer 230 while allocating logic blocks. In allocating logic blocks, a logic block having the smallest number of block wearing times is first allocated for the purpose of evening wearing degrees over the logic blocks.

FIG. 5B shows a logic block storing hot data (HD). Referring to FIG. 5B, a header of the logic block stores the number of block wearing times Blk_cnt. The logic block includes pluralities of entries E1~E4. Each entry stores hot data HD.

The numbers of entry wearing times, E1_cnt~E4_cnt, represent wearing degrees of the entries E1~E4. The numbers of entry wearing times, E1_cnt~E4_cnt, are referred to by the translation layer 230, being used as references for leveling wear. The numbers of entry wearing times, E1_cnt~E4_cnt, may be stored in headers of the logic blocks or in other fields. For instance, the numbers of entry wearing times, E1_cnt~E4_cnt, may be stored in the PRAM 240 in the form of table, along with the number of block wearing times Blk_cnt, and referred by the translation layer 230.

While the logic block shown in FIG. 5B includes four entries E1~E4, the present invention is not restricted thereto. The number of entries is variable in accordance with a data type.

Extending a lifetime of the semiconductor memory device requires making wearing degrees uniform over the entries. Hereinafter will be described an entry-unit wear-leveling method according to aspects of the present invention in conjunction with the accompanying drawings.

FIG. 6 shows an embodiment of an entry-unit wear-leveling method according to aspects the present invention.

Referring to FIG. 6, the logic block includes pluralities of entries E1~E4. The numbers enclosed by parentheses denote the number of wearing times. The entries E1~E4 stores hot data HD1~HD4, respectively. For instance, the first entry E1 stores the first hot data HD1 and the number of wearing times of the first entry E1 is 4 in this embodiment.

According to the present invention, data stored in an entry whose number of wearing times reaches a threshold value is exchanged for data stored in an entry whose number of wearing times is the smallest of all the entries. Data of the entry whose number of wearing times reaches a threshold value mostly has a high frequency of update, while data of the entry whose number of wearing times is the smallest of all the entries may have a low frequency of update. Through repetition with such an exchange between high and low frequency data, it is able to balance wearing degrees over the entries.

The threshold value may be set arbitrarily. For example, if data is updated frequently, a large threshold value is applied thereto. To the contrary, unless data is updated frequently, a small threshold value may be applied thereto. In the present embodiment, it is assumed that the threshold value is 5.

Now a case of correcting the hot data HD1 of the first entry E1 will be described. The number of wearing times of the first entry E1 goes to the predetermined threshold value (i.e., 5) from 4 by correction. And the third entry E3 has the smallest number of wearing times. Thus, the hot data HD1 of the first entry E1 is exchanged for the hot data HD3 of the third entry E3. Although not shown, there may be provided a buffer for exchanging data between the entries, because data of the entries could be erased by the overwriting.

Consequently, the hot data HD3 is stored in the first entry E1 and the hot data HD1 is stored in the third entry E3. Thus, the first and third entries, E1 and E3, are all changed to have their corrected numbers of entry wearing times, 5 and 2, respectively.

Through this repetition of exchange operations, frequently updated data is stored in the entry that has been worn out the smallest number of times of all the entries. Thereby, the method is able to even or balance wearing degrees over the entries.

Figure 7:
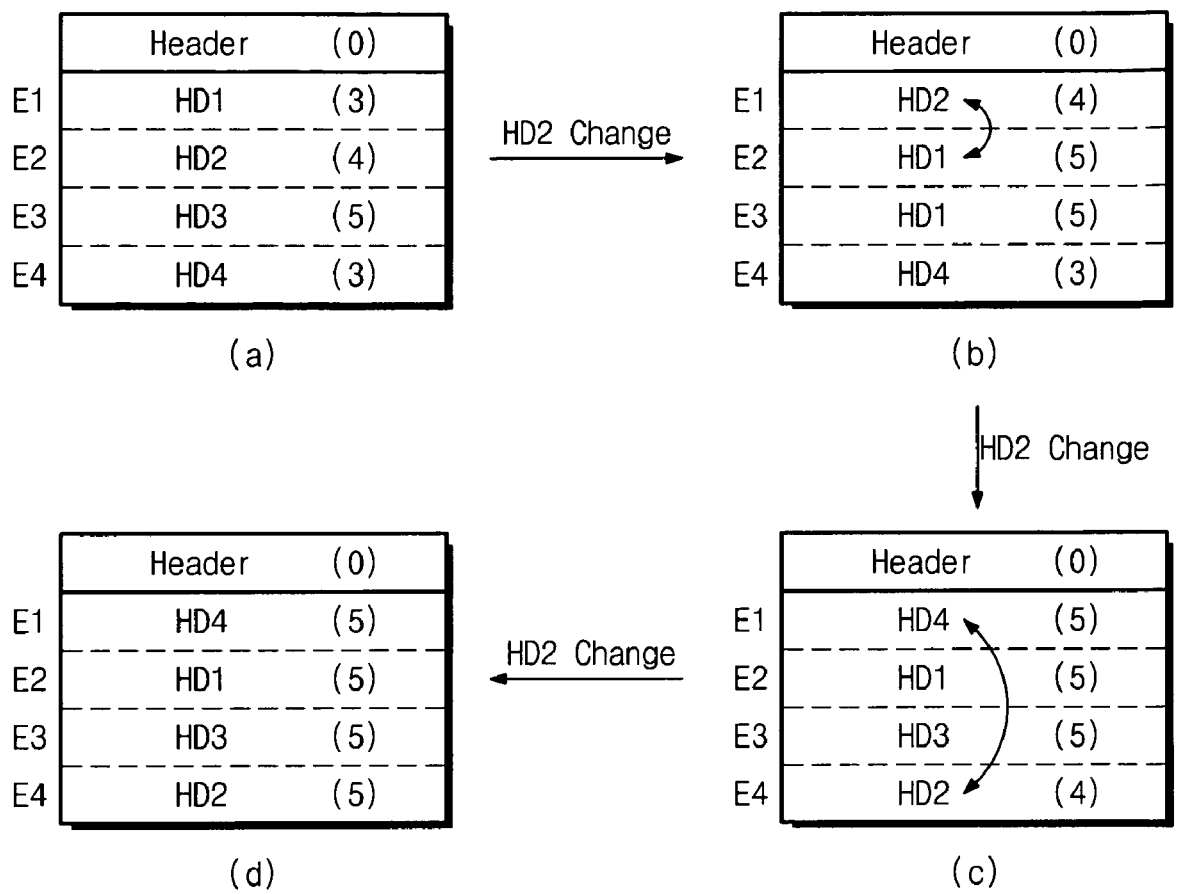
FIG. 7 shows an embodiment of a detailed procedure of the entry-unit wear-leveling method according to aspects of the present invention.

FIG. 7 shows an embodiment of a detailed procedure of the entry-unit wear-leveling method according to aspects the present invention.

Referring to FIG. 7, table (a) is a logic block that includes four entries E1~E4.

The entries E1~E4 store the hot data HD1~HD4, respectively. First, it is assumed that the hot data HD2 is changed or updated and the threshold value is 5.

As the number of wearing times of the second entry E2 is 4 in table (a), it reaches the threshold value when it is updated. Therefore, the hot data HD2 is stored in the first entry E1 in table (b) that is conditioned in the smallest number of entry wearing times. And, the hot data HD1 is stored in the second entry E2. Thereby, the hot data HD1 is exchanged for the hot data HD2 in location. Referring to table (b) FIG. 7, the numbers of wearing times of the first and second entries E1 and E2 become 4 and 5, respectively.

Next, it is assumed that the hot data HD2 is updated again. The number of wearing times of the first entry E1 reaches the predetermined threshold value from 4 upon update. Then, the hot data HD2 is stored in the fourth entry E4 in table (c) that has the smallest number of entry wearing times. And, the hot data HD4 is stored in the first entry E1. Consequently, the hot data HD2 is exchanged for the hot data HD4 in location. Referring to table (c) in FIG. 7, the numbers of wearing times of the first and fourth entries E1 and E4 are 5 and 4, respectively.

Additionally, it can be assumed that the hot data HD2 is updated further more. As the number of wearing times of the fourth entry E4 is 4 before update, it goes to the threshold value 5 upon update. However, as shown in table (d) there is no opportunity for positional exchanges of the hot data between other entries E1~E3 because the numbers of entry wearing times of each of them have already reached at the predetermined threshold value 5. Namely, the hot data HD4 is only updated to increase the number of wearing times of the fourth entry E4. Finally, all of the entries E1~E4 are conditioned on the threshold value (e.g., 5) in the number of wearing times.

By way of the described procedure, wearing degrees are leveled over the entries. Since the most frequently updated data is stored in the entry that has the smallest number of wearing times, the procedure balances wearing degrees over the entries.

On the other hand, it is necessary to reset (or initialize) the numbers of wearing times (or wearing degree) of the entries E1~E4 when all of them reach the predetermined threshold value. Hereinafter will be described an embodiment of an initializing process according to aspects of the present invention with reference to the accompanying drawings.

Figure 8A:
FIGS. 8A through 8C show an embodiment of a process for initializing the numbers of entry wearing times by the wear-leveling method according to aspects of the present invention.
Figure 8B:
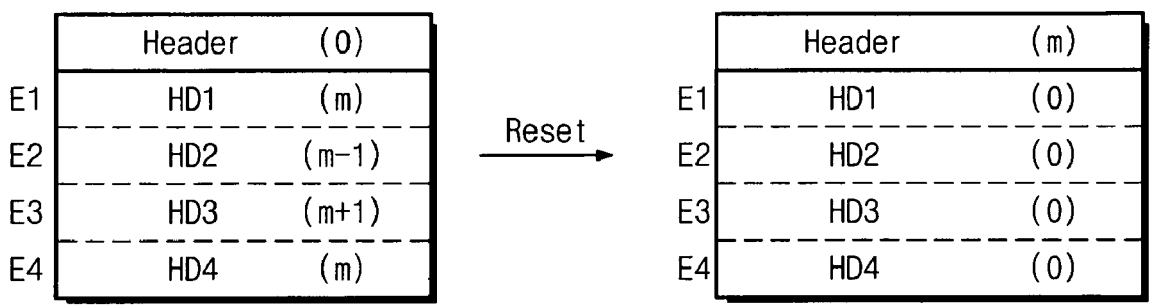
Figure 8C:
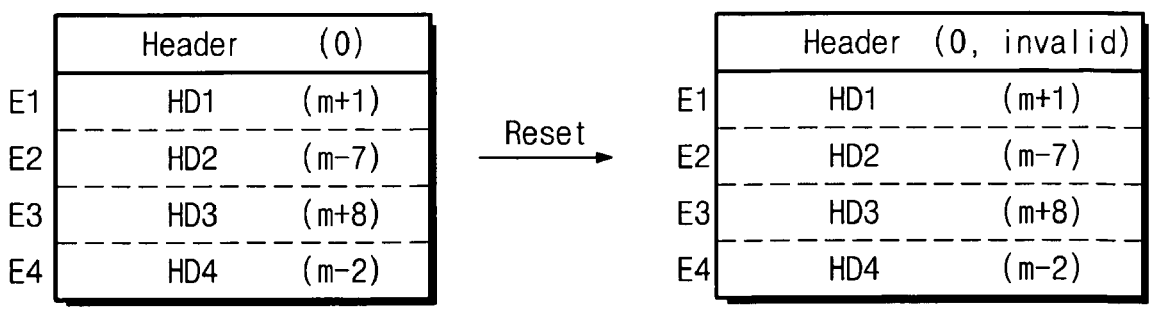

FIGS. 8A through 8C show an example embodiment of a process for initializing the numbers of entry wearing times by the wear-leveling method according to aspects of the present invention.

FIG. 8A shows a feature of initializing the numbers of entry wearing times if all of entries E1~E4 reach the predetermined threshold value, i.e., 5 in this example. Referring to FIG. 8A, if the numbers of entry wearing times reach the threshold voltage, the number of block wearing times increases as much as the threshold value. Then, the numbers of entry wearing times are reset to zero. What the number of block wearing times is 5 it means that all of the entries E1~E4 have been worn five times. Upon this condition, the initializing process is able to manage the numbers of entry wearing times by resetting them all to 0.

FIGS. 8B and 8C show features of initializing the numbers of entry wearing times in a case of retrieving a logic block. In this case, different from the feature of FIG. 8A, the initialization is carried out although all the numbers of the entry wearing times have not arrived at the threshold value.

In this embodiment, the initialization is carried out based on variation of the numbers of entry wearing times. Here, variation denotes how far the numbers of entry wearing times are from a mean value m. For instance, if the numbers of entry wearing times are far from the mean value m, it means that variation is large. To the contrary, if the numbers of entry wearing times are near to the mean value m, it means that dispersion is small.

FIG. 8B shows the initializing feature when the numbers of entry wearing times are dispersed in a small range (i.e., small variation). Referring to FIG. 8B, the numbers of entry wearing times are distributed near to the mean value m. In this case, the number of block wearing times increases by the mean value m and the numbers of entry wearing times are reset to zero. As a result, it is assumed that all of the entries have been worn out each by m times. Since the numbers of entry wearing times are conditioned in small variation, this method is effective in balancing wearing degrees.

FIG. 8C shows the initializing feature when the numbers of entry wearing times are dispersed in a wide range (i.e., large variation). Referring to FIG. 8C, the numbers of entry wearing times are distributed far from the mean value m. In this case, the header of the logic block stores invalid information. This invalid information means that the logic block is still not allocated and conditioned in a usable state, in which the numbers of entry wearing times are maintained. After then, if the logic block is allocated for data, the wear-leveling process is carried out with reference to the numbers of entry wearing times. Since there is large deviation between the numbers of entry wearing times, the numbers of entry wearing times are maintained to level wearing degrees.

While the embodiments according to the present invention are described such that a logic block corresponds to a cluster and an entry corresponds to a directory entry, it may not be restrictive hereto in structural condition. Rather, the logic blocks and entries may be sized in various forms by kinds of file systems.

The wear-leveling method according to the present invention may be also conducted by means of another file system. There are other available file systems for mobile communication devices, e.g., Symbian FAT and embedded file system 2 (EFS2).

Symbian operating system (OS) is a mobile-specific computer operating system, for mobile phones, personal data assistants (PDAs), smart phones, etc., developed by the consortium of European mobile device manufacturers, such as Nokia, Sony Ericsson, and Simens, since 1998.

The EFS2 is advanced from EFS. The EFS2 is used in a code division multiple access (CDMA) mobile phone managed by the real time executive (REX) OS of Qualcomm.

Figure 9:
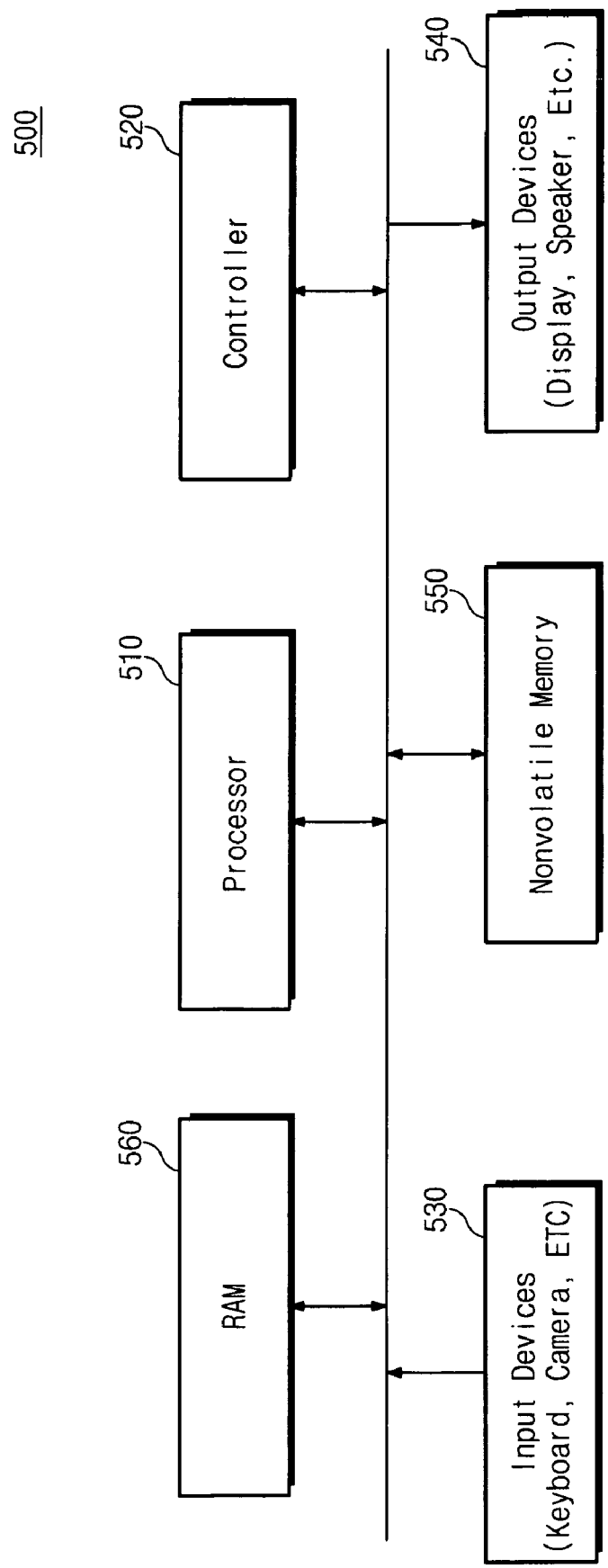
FIG. 9 is a block diagram of an embodiment of a computing system including the semiconductor memory system according to aspects of the present invention.

FIG. 9 is a block diagram of an embodiment of a computing system including a semiconductor memory system according to aspects of the present invention.

Referring to FIG. 9, the computing system 500 according to aspects the present invention is comprised of a processor 510, a controller 520, input units 530, output units 540, a flash memory 550, and a RAM 560. The solid lines denote data flows or a system bus through which commands are transferred.

In the computing system 500, data are input through the input units (e.g., keyboard, camera, etc.) 530 from external sources. Such input data are stored in the flash memory 550 or the RAM 560.

The controller 520 operates to control the components of the computing system 500 in response to commands from external sources. The processor 510 conducts processing operations in response to outputs of the controller 520. Processed results are stored in the flash memory 550 or the RAM 560.

The output units 540 operate to output data from the flash memory 550 or the RAM 560 in response to control by the controller 520. The output units 540 provide perceptible patterns for users from data stored in the flash memory 550. For example, the output units 540 may include a display device and a speaker. The flash memory 550 may operate in a wear-leveling scheme according to aspects of the present invention.

The flash memory 550 and/or the controller 520 can be mounted on the system 500 by way of various types of packages. For instance, the flash memory 550 and/or the controller 520 may be placed thereon by any known or later developed package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

Although not shown in FIG. 9, it should be understood by those skilled in the art that a power supply unit provides power to the computing system 500. And, if the computing system 500 is a kind of mobile device, it may be further comprised of a battery for supplying power thereto. The performance and capacity of the computing system 500 will be improved in proportion to enhancement of performance and capacity of the flash memory 550.

The semiconductor memory system according to aspects of the present invention is also applicable to a solid state disk (SSD). In recent years, SSD products are being spotlighted as competitive solutions capable of substituting hard disk drives (HDDs). SSDs are more advantageous than HDDs, which operate mechanically, in operation rate, external impact, and power consumption.

The semiconductor memory system according to the present invention is also employed as a portable storage device. For example, the semiconductor memory system may be used as a storage device of an MP3 player, a digital camera, a PDA, or an electronic book. Moreover, the semiconductor memory system according to the present invention may be used as a storage unit for a digital television or a personal computer.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description and figures.

What is claimed is:

1. A semiconductor memory system comprising:
   a nonvolatile memory including a plurality of logic blocks each of which is divided into a plurality of entries;
   a file system that detects a type of data to be stored and allocates a logic block or an entry for storing data in accordance with the data type; and
   a translation layer that levels wearing degrees over the allocated logic block or the allocated entry in accordance with the data type.

2. The semiconductor memory system as set forth in claim 1, wherein each entry in an allocated logic block has a number of entry wearing times and the translation layer detects whether a number of entry wearing times of an allocated entry in the allocated logic block reaches a predetermined threshold value, and exchanges data stored in the plurality of entries of the allocated logic block in accordance with a result of the detection.

3. The semiconductor memory system as set forth in claim 2, wherein the translation layer conducts the data exchange by exchanging data stored in an entry whose number of entry wearing times reaches the threshold value for data stored in another entry having a smaller number of entry wearing times.

4. The semiconductor memory system as set forth in claim 3, wherein the translation layer exchanges data of the plurality of entries for each other until all the numbers of entry wearing times of the allocated logic block reach the threshold value.

5. The semiconductor memory system as set forth in claim 2, wherein the translation layer determines the threshold value in accordance with an update frequency of data to be stored.

6. The semiconductor memory system as set forth in claim 5, wherein if the update frequency of the data to be stored is high, the translation layer increases the threshold value.

7. The semiconductor memory system as set forth in claim 5, wherein if the update frequency of the data to be stored is low, the translation layer decreases the threshold value.

8. The semiconductor memory system as set forth in claim 2, wherein if the numbers of entry wearing times of the entries in the allocated logic block reach the threshold value, the translation layer increases a number of block wearing times by the threshold value and resets the numbers of entry wearing times.

9. The semiconductor memory system as set forth in claim 2, wherein while retrieving the allocated logic block, if variation of the numbers of the entry wearing times of the entries of the allocated logic block is relatively small, the translation layer increases a number of block wearing times by a mean value of the numbers of entry wearing times of the entries of the allocated logic block and resets the numbers of entry wearing times of the entries of the allocated logic block.

10. The semiconductor memory system as set forth in claim 2, wherein while retrieving the allocated logic block, if a variation of the numbers of the entry wearing times of the entries of the allocated logic block is relatively large, the translation layer makes the allocated logic block invalid and maintains the numbers of entry wearing times of the entries of the allocated logic block.

11. The semiconductor memory system as set forth in claim 1, wherein the file system is one of a file allocation table (FAT), a Symbian FAT, and an embedded file system 2 (EFS2).

12. The semiconductor memory system as set forth in claim 1, wherein if data to be stored is hot data, the file system allocates an entry for storing the hot data.

13. The semiconductor memory system as set forth in claim 1, wherein if data to be stored is cold data, the file system allocates a logic block for storing the cold data.

14. The semiconductor memory system as set forth in claim 1, wherein the translation layer allocates the logic block with reference to a number of block wearing times.

15. The semiconductor memory system as set forth in claim 14, wherein the translation layer first allocates a logic block that has a smallest number of wearing times.

16. The semiconductor memory system as set forth in claim 1, wherein the nonvolatile memory is overwritable.

17. The semiconductor memory system as set forth in claim 1, wherein the nonvolatile memory is one of a phase-changeable random access memory, a magnetic random access memory, and a ferroelectric random access memory.

18. The semiconductor memory system as set forth in claim 1, wherein the allocated logic block is sized in accordance with a type of the file system.

19. The semiconductor memory system as set forth in claim 18, wherein the file system provides size information of the allocated logic block to the translation layer.

20. The semiconductor memory system as set forth in claim 18, wherein the file system determines a size of the allocated logic block for a building or mounting time.

21. The semiconductor memory system as set forth in claim 1, wherein the allocated entry is sized in accordance with a type of the file system.

22. The semiconductor memory system as set forth in claim 21, wherein the file system provides size information of the allocated entry to the translation layer.

23. The semiconductor memory system as set forth in claim 21, wherein the file system determines a size of the allocated entry for a building or mounting time.

24. A wear-leveling method for a semiconductor memory system having a plurality of logic blocks each of which is divided into a plurality of entries, the method comprising:

detecting a type of data to be stored and allocating a logic block or an entry for data in accordance with the data type; and managing wearing degrees over the allocated logic block or the allocated entry in accordance with the data type.

* * * * *